US010421218B2

(12) United States Patent
Kawaguchi et al.

(10) Patent No.: US 10,421,218 B2
(45) Date of Patent: *Sep. 24, 2019

(54) ROLLER-TYPE DEPRESSING DEVICE, IMPRINTING DEVICE, AND ROLLER-TYPE DEPRESSING METHOD

(71) Applicant: SCIVAX CORPORATION, Kanagawa (JP)

(72) Inventors: Hirosuke Kawaguchi, Kanagawa (JP); Yutaka Taniguchi, Kanagawa (JP); Yukimasa Saito, Tokyo (JP); Masaki Sugiyama, Tokyo (JP); Daisuke Matono, Tokyo (JP); Satoru Tanaka, Kanagawa (JP)

(73) Assignee: SCIVAX CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/891,429

(22) PCT Filed: Jun. 3, 2015

(86) PCT No.: PCT/JP2015/066026
§ 371 (c)(1),
(2) Date: Nov. 16, 2015

(87) PCT Pub. No.: WO2015/186736
PCT Pub. Date: Dec. 10, 2015

(65) Prior Publication Data
US 2017/0072620 A1    Mar. 16, 2017

(30) Foreign Application Priority Data
Jun. 3, 2014  (JP) .................................. 2014-114804

(51) Int. Cl.
*B29C 59/04*      (2006.01)
*B29C 43/36*      (2006.01)
(Continued)

(52) U.S. Cl.
CPC ........ *B29C 43/3697* (2013.01); *B29C 43/361* (2013.01); *B29C 59/002* (2013.01);
(Continued)

(58) Field of Classification Search
CPC ... B29C 43/46; B29C 2043/467; B29C 59/04; B29C 2791/006; B29C 2791/007
See application file for complete search history.

(56) References Cited

U.S. PATENT DOCUMENTS 3,461,704 A * 8/1969 Rastelli ................. B21B 13/147
                                                                72/242.4
4,487,050 A * 12/1984 Kajiwara ............... B21B 13/147
                                                                72/241.8
(Continued)

FOREIGN PATENT DOCUMENTS

JP          58055104 A  *  4/1983  ............ B21B 31/10
JP          01178319 A  *  7/1989
(Continued)

OTHER PUBLICATIONS

Office Action in U.S. Appl. No. 14/402,402 dated Nov. 1, 2017, 32 pages.
(Continued)

*Primary Examiner* — Atul P. Khare
(74) *Attorney, Agent, or Firm* — Schroeder Intellectual Property Law Group, LLC

(57) ABSTRACT

A roller-type depressing device, an imprinting device, and a roller-type depressing method which are capable of suppressing an uneven elastic deformation of a main roller, and which are also capable of depressing an object uniformly. A
(Continued)

roller-type depressing device depresses an object, and includes a main roller having at least a surface formed of an elastic material, and depressing the object, a roller moving unit moving the main roller relative to the object, a pressure adjusting unit adjusting pressure applied to the object by the main roller, a pressure receiving stage receiving the pressure from the main roller via the object, an intermediate roller having at least a surface formed of a material with a larger elastic modulus than the elastic material, and supporting the main roller, and, a backup roller formed shorter in an axial direction than the main roller and the intermediate roller, and supporting the intermediate roller.

11 Claims, 5 Drawing Sheets

(51) Int. Cl.
  *B29C 59/02* (2006.01)
  *H01L 21/027* (2006.01)
  *B29C 59/00* (2006.01)
  *B29L 11/00* (2006.01)
(52) U.S. Cl.
  CPC ............ *B29C 59/02* (2013.01); *B29C 59/022* (2013.01); *B29C 59/04* (2013.01); *H01L 21/027* (2013.01); *B29C 2043/3613* (2013.01); *B29C 2059/023* (2013.01)

(56) References Cited

U.S. PATENT DOCUMENTS

| | | | |
|---|---|---|---|
| 4,635,458 A * | 1/1987 | Bradlee | B21D 1/02 72/163 |
| 4,800,742 A * | 1/1989 | Feldmann | B21B 13/142 72/247 |
| 4,955,221 A * | 9/1990 | Feldmann | B21B 13/142 72/247 |
| 4,984,009 A | 1/1991 | Makino et al. | |
| 5,355,707 A * | 10/1994 | Inoue | B21B 13/147 72/245 |
| 6,829,050 B2 * | 12/2004 | Ikeda | B29C 59/046 264/1.6 |
| 7,622,238 B2 * | 11/2009 | Uematsu | G03G 5/043 430/130 |
| 8,210,015 B2 * | 7/2012 | Kneppe | B21B 13/142 72/247 |
| 8,215,944 B2 * | 7/2012 | Takaya | B29C 59/022 264/293 |
| 9,808,985 B2 | 11/2017 | Kawaguchi et al. | |
| 2002/0098257 A1 | 7/2002 | Ikeda et al. | |
| 2003/0030188 A1 * | 2/2003 | Spengler | B29C 37/0032 264/458 |
| 2007/0163321 A1 * | 7/2007 | Brown | B21D 1/02 72/163 |
| 2009/0174118 A1 * | 7/2009 | Maeda | B29C 59/022 264/323 |
| 2010/0052216 A1 | 3/2010 | Kim et al. | |
| 2011/0024948 A1 * | 2/2011 | Takaya | B29C 59/022 264/293 |
| 2011/0219840 A1 * | 9/2011 | Uesugi | B21B 13/147 72/224 |
| 2011/0298159 A1 * | 12/2011 | Jang | B82Y 10/00 264/447 |
| 2013/0008591 A1 * | 1/2013 | Kondo | B29C 51/06 156/212 |
| 2013/0136817 A1 * | 5/2013 | Kawaguchi | G03F 7/0002 425/385 |
| 2013/0139712 A1 | 6/2013 | Lee et al. | |
| 2015/0079354 A1 * | 3/2015 | Sakamoto | G02B 1/118 428/172 |

FOREIGN PATENT DOCUMENTS

| | | |
|---|---|---|
| JP | 01-217346 A | 8/1989 |
| JP | 02-069745 A | 3/1990 |
| JP | 0 365 304 A2 | 4/1990 |
| JP | 02-120861 A | 5/1990 |
| JP | 02-282254 A | 11/1990 |
| JP | 2001-058352 | 3/2001 |
| JP | 2001058352 A * | 3/2001 |
| JP | 2005-178368 A | 7/2005 |
| JP | 2005178368 A * | 7/2005 |
| JP | 2006-326948 A | 12/2006 |
| JP | 2007-058943 | 3/2007 |
| JP | 2008-155521 | 7/2008 |
| JP | 2009-154393 | 7/2009 |
| JP | 2009-291949 | 12/2009 |
| JP | 2011-183782 | 9/2011 |
| JP | 2013-119254 | 6/2013 |
| JP | 2014-172331 A | 9/2014 |
| WO | 2004062886 | 7/2007 |
| WO | 2012029843 | 3/2012 |
| WO | 2013191206 | 12/2013 |
| WO | 2014/088107 A1 | 6/2014 |
| WO | 2012147958 | 7/2014 |

OTHER PUBLICATIONS

Office Action in U.S. Appl. No. 14/402,402 dated Jul. 10, 2018, 21 pages.

* cited by examiner

[FIG. 1]
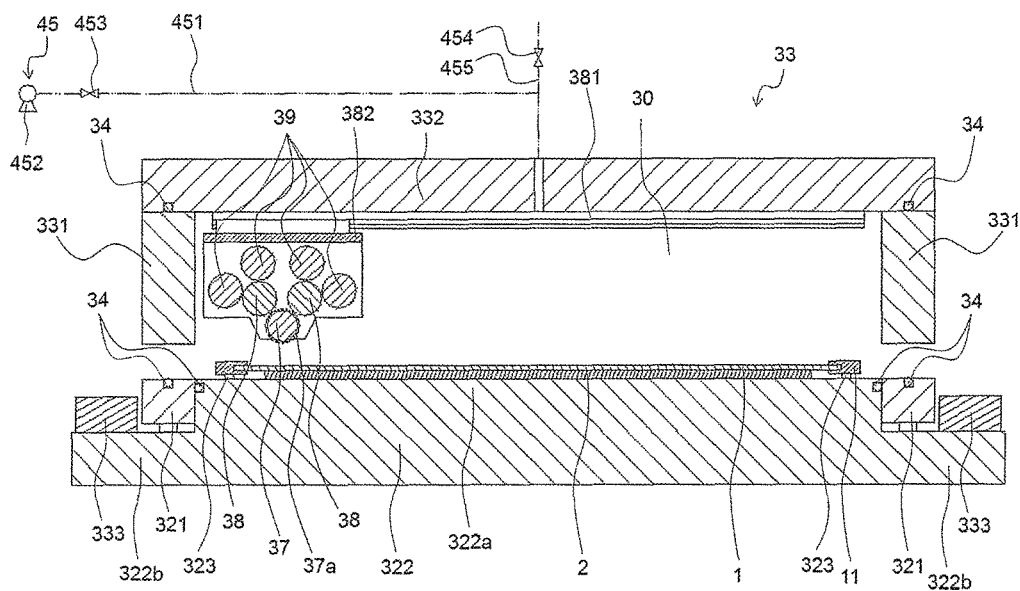
[FIG. 2]
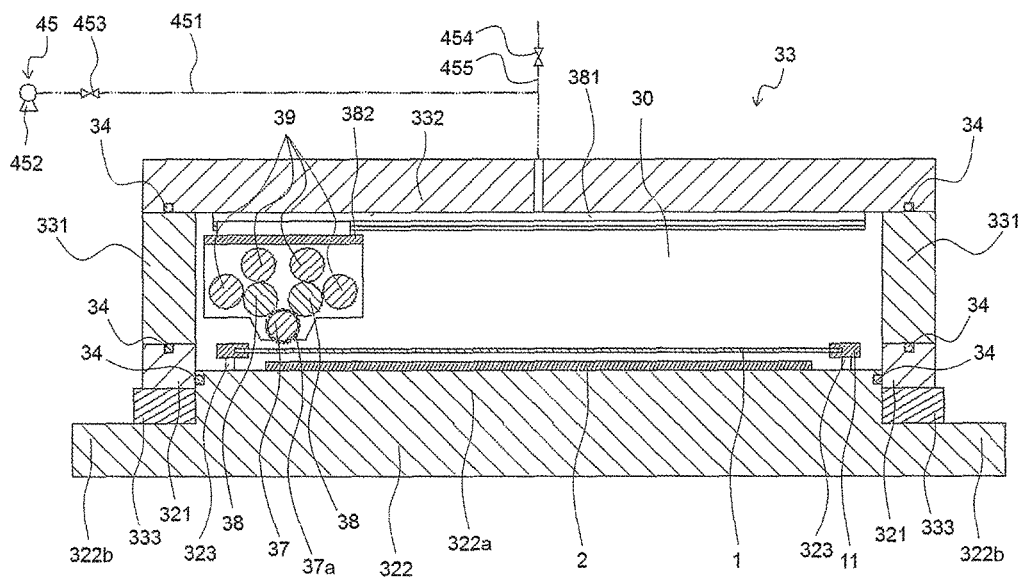

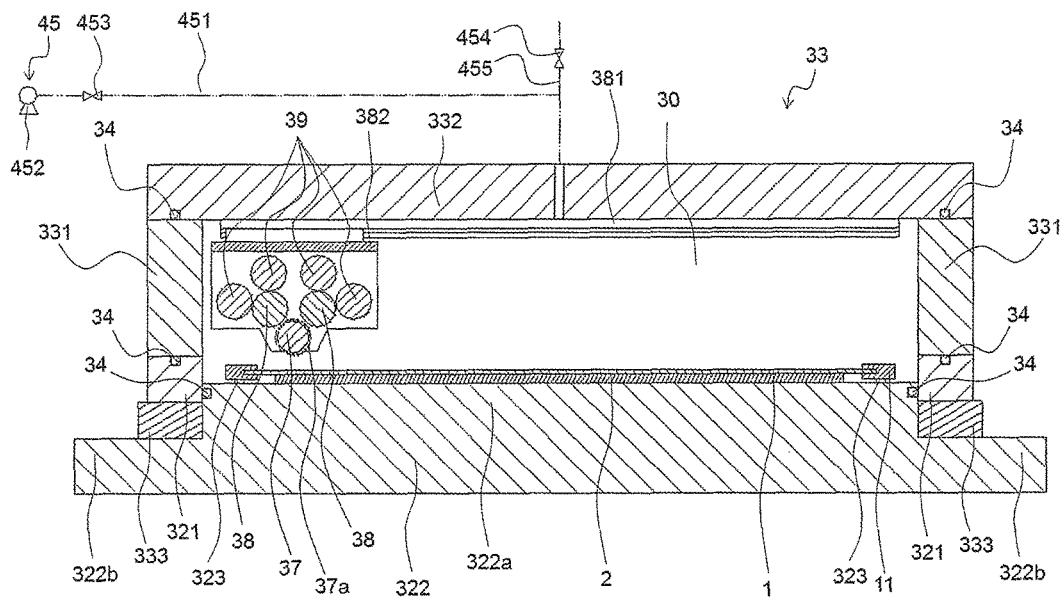
[FIG. 3]
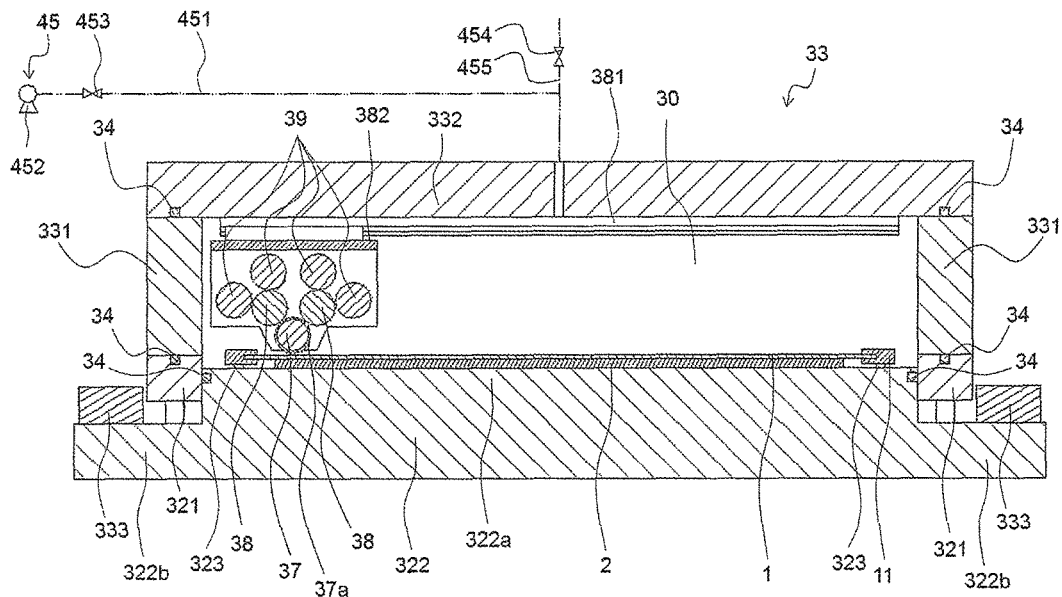
[FIG. 4]

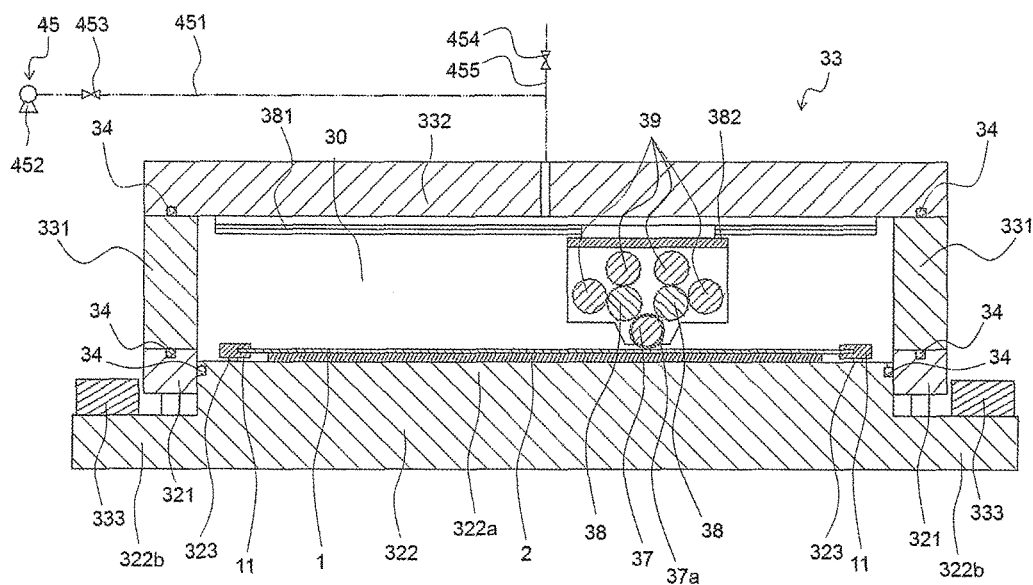
[FIG. 5]

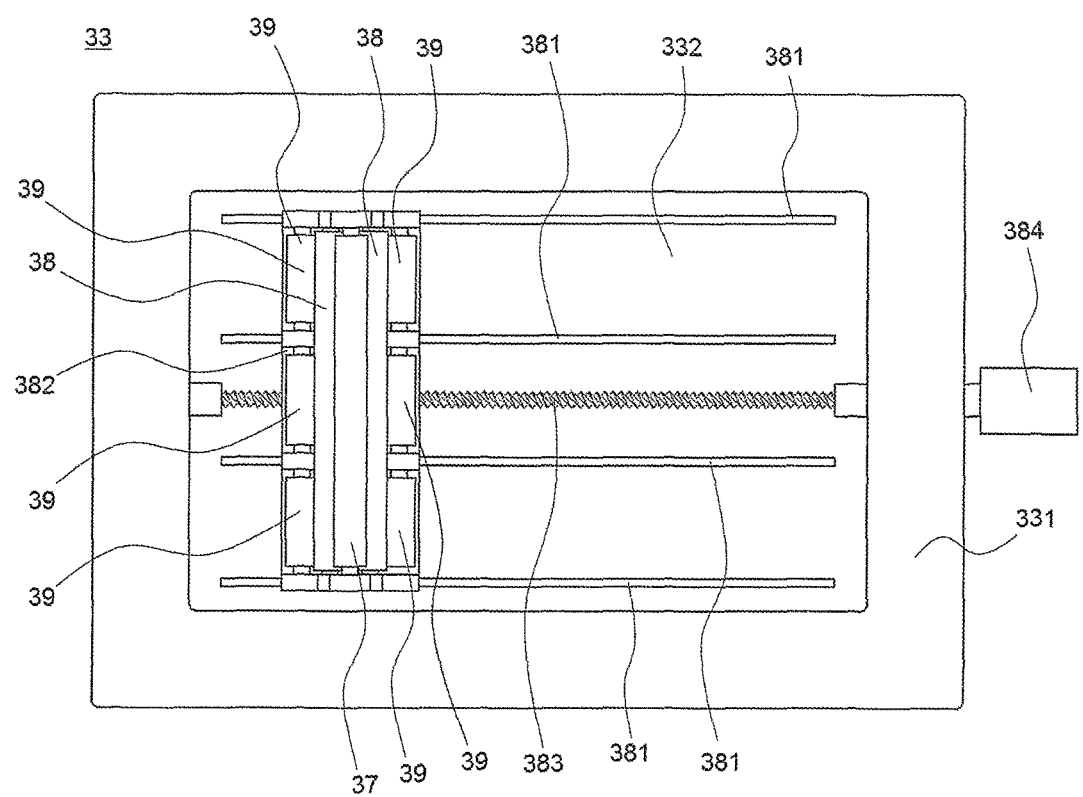

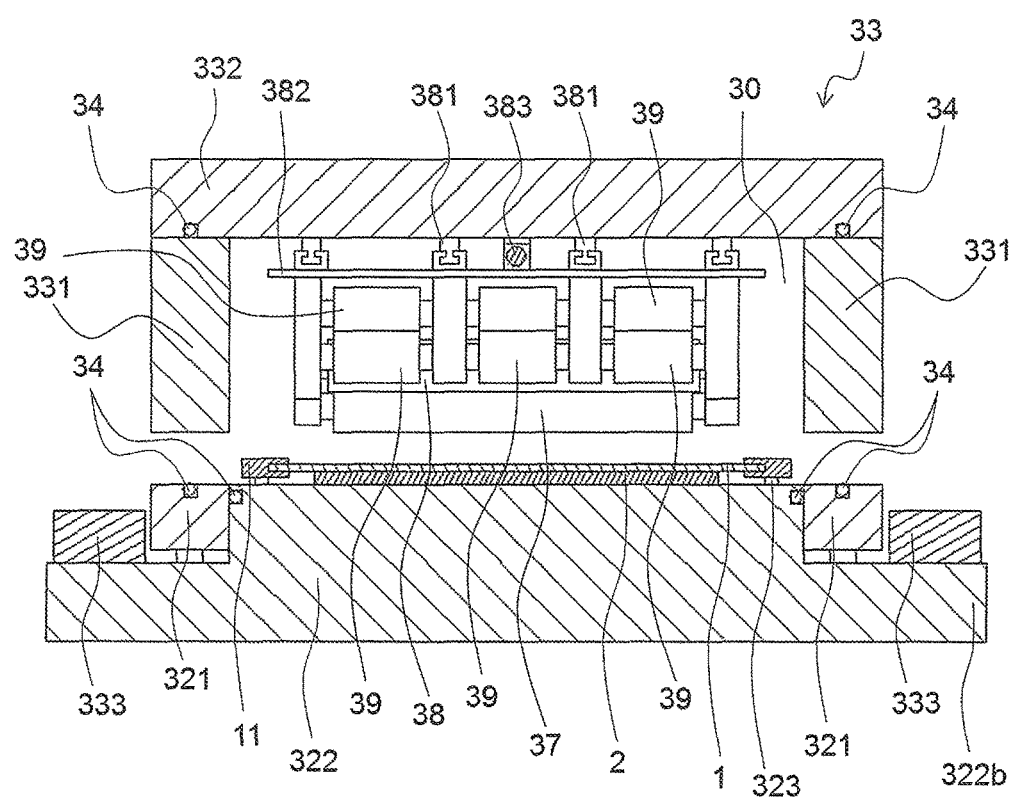
[FIG. 7]

ROLLER-TYPE DEPRESSING DEVICE, IMPRINTING DEVICE, AND ROLLER-TYPE DEPRESSING METHOD

RELATED APPLICATIONS

The present application is a national phase application of International Patent Application No. PCT/JP2015/066026, filed Jun. 3, 2015, which claims the filing benefit of Japanese Patent Application No. 2014-114804, filed Jun. 3, 2014, the contents of both of which are incorporated herein by reference.

TECHNICAL FIELD

The present disclosure relates to a roller-type depressing device that depresses an object by a roller, an imprinting device and a roller-type depressing method that utilize the same.

BACKGROUND ART

Conventionally, a nano-imprinting technology is known to form a micropattern in a micro or nano order. This technology is to depress a die with a micropattern against a molding target like a resin, and to transfer the pattern to the molding target by heat or light (see, for example, Patent Literature 1). In addition, an imprinting device is also known which depresses a die and a molding target by a roller and which transfers the pattern in order to increase the transfer area (see, for example, Patent Literature 2).

CITATION LIST

Patent Literature

Patent Literature 1: WO2004/062886
Patent Literature 2: WO2013/191206

SUMMARY OF INVENTION

Technical Problem

According to the device disclosed in Patent Literature 2, the roller is supported at both ends only. According to this structure, when the roller is elongated, depress force around the center decreases relative to depress forces at both ends. Hence, such a roller (hereinafter, referred to as a "main roller") may be supported by a backup roller. When, however, at least a surface of the main roller is formed of an elastic material in order to make the depress force to the object uniform, when the main roller is supported by the backup roller, the supported elastic material causes an uneven elastic deformation. When the main roller depresses the object before the uneven deformation is recovered, the depress force becomes uneven based on this uneven deformation.

Therefore, it is an objective of the present disclosure to provide a roller-type depressing device, an imprinting device, and a roller-type depressing method which are capable of suppressing an uneven elastic deformation of a main roller, and which are also capable of depressing an object uniformly.

Solution to Problem

In order to accomplish the above objective, a roller-type depressing device according to the present disclosure depresses an object, and the device includes:

a main roller which has at least a surface formed of an elastic material, and which depresses an object;

a roller moving unit that moves the main roller relative to the object;

a pressure adjusting unit that adjusts pressure applied to the object by the main roller;

a pressure receiving stage that receives the pressure from the main roller via the object;

an intermediate roller which has at least a surface formed of a material that has a larger elastic modulus than the elastic material, and which supports the main roller; and a backup roller which is formed so as to be shorter in an axial direction than the main roller and the intermediate roller, and which supports the intermediate roller.

In this case, the main roller may be disposed on the pressure adjusting plate via the backup roller and the intermediate roller, and, the pressure adjusting unit may include a pressure adjuster that adjusts the pressure applied to the main roller via the pressure adjusting plate. In addition, the pressure adjusting unit may include a pressure adjusting plate holder that holds the pressure adjusting plate so as to apply force to the main roller, the force produced by a pressure difference in fluid applied to both surfaces of the pressure adjusting plate, and, the pressure adjuster that adjusts the pressure difference in fluid applied to both surfaces of the pressure adjusting plate. Still further, the roller moving unit may be disposed on the pressure adjusting plate. Yet still further, a plurality of the intermediate rollers may be disposed on a circumference of the main roller. Moreover, a plurality of the backup rollers may be also disposed on a circumference of the main roller. In this case, the plurality of backup rollers may be disposed at both sides of a plane that interconnect a rotation center of the main roller with a rotation center of each of the intermediate rollers at an equal angle. In addition, the intermediate roller is formed of a metal or ceramics.

An imprinting device according to the present disclosure includes the aforementioned roller-type depressing device.

A roller-type depressing method according to the present disclosure is to apply pressure to an object by a main roller that has at least a surface formed of an elastic material, and the method includes:

a disposing process of disposing the object on a pressure receiving stage;

a pressure adjusting process of adjusting the pressure applied by the main roller to the object;

and a pressure applying process of moving the main roller relative to the object, and applying the pressure to the object by the main roller, in which, in the pressure applying process, the main roller is supported by an intermediate roller that has at least a surface formed of a material which has a larger elastic modulus than the elastic material, and the intermediate roller is supported by a backup roller formed so as to be shorter in the axial direction than the main roller and the intermediate roller.

In this case, in the pressure adjusting process, the pressure applied to the object by the main roller may be adjusted by utilizing a pressure difference in fluid applied to both surfaces of a pressure adjusting plate that supports the main roller via the backup roller and the intermediate roller. In addition, a plurality of the intermediate rollers may support the main roller at a forward location and a backward location in a moving direction of the main roller. Still further, a plurality of the backup rollers may support the intermediate rollers at a forward location and a backward location in a moving direction of the intermediate roller. Yet still further, the intermediate roller may be formed of a metal or ceramics.

Advantageous Effects of Invention

According to the roller-type depressing device, imprinting device, and roller-type depressing method of the present disclosure, the intermediate roller that has at least a surface formed of a material with a larger elastic modulus than that of the elastic material of the main roller. Hence, an uneven elastic deformation in the main roller is suppressed, thereby applying pressure to the object uniformly.

It is to be understood that the aspects and objects of the present invention described above may be combinable and that other advantages and aspects of the present invention will become apparent upon reading the following description of the drawings and detailed description of the invention.

BRIEF DESCRIPTION OF DRAWINGS

FIG. 1 is a side cross-sectional view illustrating an imprinting device according to the present disclosure;
FIG. 2 is a side cross-sectional view illustrating the imprinting device according to the present disclosure;
FIG. 3 is a side cross-sectional view illustrating the imprinting device according to the present disclosure;
FIG. 4 is a side cross-sectional view illustrating the imprinting device according to the present disclosure;
FIG. 5 is a side cross-sectional view illustrating the imprinting device according to the present disclosure;
FIG. 6 is a plan view illustrating a casing for the imprinting device according to the present disclosure; and
FIG. 7 is a front cross-sectional view illustrating the imprinting device according to the present disclosure.

DESCRIPTION OF EMBODIMENTS

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

A roller-type depressing device according to the present disclosure is to depress an object, and mainly includes, as illustrated in FIG. 1, a main roller 37 which has at least a surface formed of an elastic material 37a, and which depresses an object, a roller moving unit that moves the main roller 37 relative to the object, a pressure adjusting unit that adjusts pressure applied to the object by the main roller 37, a pressure receiving stage 322 that receives the pressure from the main roller 37 via the object, an intermediate roller 38 which has at least a surface formed of a material that has a larger elastic modulus than that of the elastic material 37a, and which supports the main roller 37, and a backup roller 39 which is formed so as to be shorter in the axial direction than the main roller 37 and the intermediate roller 38, and which supports the intermediate roller 38.

Note that in this specification, the term object means one to be depressed by the main roller 37, but is not necessary as being a single component, and may be multiple components. When, for example, the roller-type depressing device of the present disclosure is built in an imprinting device, the object means both a die 1 and a molding target 2. In addition, the purpose to depress the object is not limited to a deformation of the object. For example, the depressing operation may be performed to repel a gas present between the die 1 and the molding target 2. In the following explanation and in FIGS. 1 to 7, it is assumed that the roller-type depressing device of the present disclosure is built in an imprinting device, and the object is the die 1 and the molding target 2 both utilized in imprinting.

The die 1 is formed of, for example, a metal like nickel, ceramics, a carbon material like glass-like carbon, or silicon, and has a predetermined mold pattern formed on one end face (molding face). This mold pattern can be formed by applying precise machining process to the molding face. In addition, the mold pattern can be formed by applying semiconductor microfabrication technology like etching to a silicon substrate, etc. or by applying an electro-forming technique like nickel plating to the surface of the silicon substrate to form a metal plating layer, and by peeling this metal plating layer. Still further, a resin-made die formed through an imprinting technology is also applicable. In this case, the die may be formed as a flexible film relative to the molding target surface of the molding target 2. Needless to say, the material of the die 1 and the production scheme thereof are not limited to any particular ones as long as the die is capable of transferring a mold pattern.

The mold pattern formed on the die 1 is not limited to a geometrical shape with concavities and convexities, but includes ones for transferring a predetermined surface condition like a transfer of a mirror-like condition with a predetermined surface roughness. In addition, the mold pattern can be formed in various sizes such that the minimum dimension of the width of the concavity and that of the convexity in the planar direction are equal to or smaller than 100 equal to or smaller than 10 µm, equal to or smaller than 2 µm, equal to or smaller than 1 µm, equal to or smaller than 100 nm, and equal to or smaller than 10 nm. Still further, the dimension in the depthwise direction can be also formed in various sizes, such as equal to or larger than 10 nm, equal to or larger than 100 nm, equal to or larger than 200 nm, equal to or larger than 500 nm, equal to or larger than 1 µm, equal to or larger than 10 µm, and equal to or larger than 100 µm.

The molding target 2 means one including a substrate or a film which is formed of a resin, an inorganic compound or a metal, and on which a molding target layer is formed, but may be simply a substrate itself or a flexible film itself. In addition, a molding target layer with a fluidity may be formed on the die 1, and the molding target layer may be joined with the substrate when the substrate and the die are depressed against each other. An example material of the molding target 2 is a photo-curable resin, a thermosetting resin, or a thermoplastic resin.

Example photo-curable resins or thermosetting resins are epoxide-containing compounds, (metha) acrylate ester compounds, or unsaturated hydrocarbon-radial containing compounds of vinyl radial and allyl radial, such as vinyl ether compounds, bisallylnadimide compounds. In this case, for the purpose of a thermal polymerization, a polymerization reaction radial containing compound can be applied singularly, or an initiator with a thermal reactivity may be added to improve the thermal curing properties. In addition, a photoreactive initiator may be added to let a polymerization reaction advanced upon irradiation with light, thereby forming a mold pattern. Example suitable radial initiators with a thermal reactivity are organic peroxide and azo compound, and example suitable photoreactive radial initiators are acetophenone derivative, benzophenone derivative, benzoin ether derivative, and xanthone derivative. The reactive monomer may be utilized in a solventless form, or may be dissolved in a solvent and desolvated after application.

Example thermoplastic resins are cyclic olefin-based resins, such as cyclic-olefin ring-open polymer hydrogen added substance (COP) and cyclic-olefin copolymer (COC), an acrylic resin, polycarbonate, a vinyl-ether resin, fluorine resins, such as perfluoroalkoxyalkane (PFA) or polytetrafluoroethylene (PTFE), polystyrene, a polyimide-based resin, and a polyester-based resin.

In FIG. 1, the molding target 2 is disposed at the pressure-receiving-stage-322 side, while the die 1 is disposed at the main-roller-37 side, but the die 1 may be disposed at the pressure-receiving-stage-322 side, while the molding target 2 may be disposed at the main-roller-37 side. In addition, it is preferable that either the die 1 or the molding target 2 disposed at the main-roller-38 side should be formed as a flexible film.

The main roller 37 is formed in, for example, a cylindrical shape, holds the objects that are the die 1 and the molding target 2 together with the pressure receiving stage 322, and depresses those objects against each other. Both ends of a shaft of the main roller 37 are coupled with the roller moving unit in a freely rotatable manner. Hence, when the roller moving unit moves the main roller 37, the rolling main roller 37 depresses the die 1 and the molding target 2 against each other. The material of the main roller 37 is not limited to any particular one as long as it matches the molding condition, but when, for example, the main roller is applied to an imprinting process, it is desirable that the material should have the pressure resistance and the heat resistance under the molding condition. In addition, in order to surely apply uniform pressure to the die 1 and the molding target 2 that are the objects, at least the surface of the main roller 37 is formed of the elastic material 37a that is capable of deforming within an appropriate range. An example elastic material 37a applicable is a urethane resin. In this case, the thickness of the elastic material 37a can be set as needed, but in the case of a urethane resin, the thickness may be set to substantially 5 to 10 mm.

In addition, in order to increase a transfer area, it is necessary to elongate the main roller 37 in the axial direction. When, however, the main roller 37 is supported at both ends of the shaft only, if the main roller 37 is elongated, pressure is large at both supported ends of the main roller 37, but the pressure decreases toward the center part. Hence, the depressing device or the imprinting device of the present disclosure includes the backup roller 39 that makes pressure from the main roller 37 uniform in the axial direction. However, as explained above, at least the surface of the main roller 37 is formed of the elastic material 37a. Accordingly, when the main roller 37 is supported by the backup roller 39, the surface of the main roller 37 causes an elastic deformation. Since the backup roller 39 is shorter than the main roller 37 in the axial direction, when the backup roller 39 directly supports the main roller 37, an uneven elastic deformation is caused in the surface of the main roller 37 between the part that abuts the backup roller 39 and the part not abutting the backup roller. Hence, when the main roller 37 depresses the object before this uneven elastic deformation is recovered, an uneven pressure application occurs due to the uneven elastic deformation. Therefore, according to the present disclosure, the intermediate roller 38 formed of a material that has a larger elastic modulus (Young's modulus), than that of the elastic material disposed on the surface of the main roller 37 is disposed between the main roller 37 and the backup roller 39. Hence, in comparison with a case in which the main roller 37 is directly supported by the backup roller 39, at least the deformation amount of the elastic material 37a can be reduced, thereby suppressing an uneven pressure application. When the intermediate roller 38 is formed of a material that has a larger elastic modulus than that of the elastic material disposed on the surface of the main roller 37, an uneven pressure application is preventable, but more preferably, a metal like iron or other inorganic compounds that hardly causes an elastic deformation is applied. It is appropriate if the intermediate roller 38 is formed so as to be longer than at least a length in which an uneven depress to the object should be avoided, and for example, formed longer than the main roller 37.

More specifically, as illustrated in FIG. 7, the intermediate roller 38 is formed in a cylindrical shape that is longer than the backup roller 39 in the axial direction, and is disposed so as to support forces from the main roller 37 and the backup roller 39 through the circumference. In addition, both ends of a shaft of the intermediate roller 38 are coupled with the roller moving unit in a freely rotatable manner. Hence, the intermediate roller 38 is capable of moving together with the main roller 37 while rotating together with the rotation of the main roller 37 with both ends being as a rotation center, and applying, to the main roller 37, force received from the backup roller 39.

Still further, it is preferable that, as illustrated in FIG. 1, a plurality of intermediate rollers 38 should be disposed so as to abut the circumference of the main roller 37. For example, the intermediate rollers 38 are disposed one by one between the main roller 37 and the backup roller 39 at the forward location and the backward location in the moving direction of the main roller 37 and at an equal angle from the rotation center of the main roller 37. By employing this structure, it becomes possible to prevent the rotation axis of the main roller 37 from shifting toward the forward or backward location in the moving direction, thereby stabilizing the movement of the main roller 37 and depress force. Needless to say, the number of intermediate rollers 38 is not limited to two, and equal to or greater than three intermediate rollers may be disposed.

The backup roller 39 is disposed at a side that enables the backup roller to support force from the main roller 37 to the intermediate roller 38, and is disposed so as to abut the circumference of the intermediate roller 38, thereby making pressure of the main roller 37 uniform in the axial direction. More specifically, as illustrated in FIGS. 1 and 7, the backup roller 39 is formed in a cylindrical shape that is shorter than the main roller 37 and the intermediate roller 38 in the axial direction, and is disposed so as to support, at both ends of a shaft, force from a pressure adjusting unit (pressure adjusting plate 332), and to support, at the circumference, force from the intermediate roller 38. In addition, the both ends of the shaft of the backup roller 39 are coupled with the roller moving unit in a freely rotatable manner. Hence, the backup roller 39 is capable of moving together with the intermediate roller 38 and the main roller 37 while rotating together with the rotation of the intermediate roller 38 with both ends being as a rotation center, and applies, to the intermediate roller 38, force from the pressure adjusting unit (pressure adjusting plate 332).

As illustrated in FIG. 1, it is preferable that a plurality of backup rollers 39 should be disposed so as to abut the circumferences of the respective intermediate rollers 38. For example, the backup roller 39 is disposed one by one at both sides of a plane that interconnects the rotation center of the main roller 37 with the rotation center of the intermediate roller 38, and at an equal angle. By employing this structure, it becomes possible to prevent the rotation center of the intermediate roller 38 from shifting, thereby stabilizing the movement of the intermediate roller 38 and depress force. Needless to say, the number of backup rollers 39 is not limited to two, and equal to or greater than three backup rollers may be disposed.

The pressure adjusting unit is to adjust pressure applied to the object by the main roller 37. The pressure adjusting unit may be constructed by, for example, a pressure adjusting plate holder which allows the main roller 37 to be disposed on the pressure adjusting plate 332 via the backup roller 39 and the intermediate roller 38, and which holds the pressure adjusting plate 332 so as to apply, to the main roller 37, force produced by a pressure difference in fluid applied to both ends of the pressure adjusting plate 332, and a pressure adjuster that adjusts the pressure difference in fluid applied to both surfaces of the pressure adjusting plate 332.

The pressure adjusting plate 332 has the main roller 37, the intermediate roller 38, and the backup roller 39, etc., disposed on the pressure adjusting plate, and applies, to the main roller 37, force produced by the pressure difference in fluid applied to both surfaces of the pressure adjusting plate. The material of the pressure adjusting plate 332 is not limited to any particular one as long as it matches the molding condition, but when, for example, the pressure adjusting plate is applied to an imprinting process, it is desirable that the material should have the pressure resistance and the heat resistance under the molding condition. Hence, a metal like stainless steel is applicable.

The pressure adjusting plate holder holds the pressure adjusting plate 332 in such a way that the force produced by the pressure difference in fluid applied to both surfaces of the pressure adjusting plate 332 is applied to the object via the main roller 37. For example, as illustrated in FIG. 1, the pressure adjusting plate holder is constructed by the pressure adjusting plate 332, a first frame 331, and a second frame 321. The first frame 331 is formed in a rectangular cylindrical shape that has an opening in which a protrusion 322a of the pressure receiving stage 322 to be discussed later is fittable. In addition, by fastening the pressure adjusting plate 332 with the first frame 331, a casing 33 with a bottom and also an opening is constructed. Still further, by closing the opening of the casing 33 with the second frame 321 and the pressure receiving stage 322, a pressure adjusting room 30 that is a sealed space is constructed. In addition, the second frame 321 is formed with an opening which is formed in substantially the same shape as that of the protrusion 322a of the pressure receiving stage 322, and in which the protrusion is fittable, and, is formed in a cylindrical shape capable of abutting the first frame 331. The second frame 321 is supported by constant fluid pressure by, for example, an air cylinder, and is formed so as to be movable up and down relative to the side face of the protrusion of the pressure receiving stage 322 by external force. By constructing the second frame 321 as explained above, the casing 33 including the pressure adjusting plate 332 is still freely movable relative to the pressure receiving stage 322 even abutting the second frame 321. Hence, the force produced by the pressure difference in fluid applied to both surfaces of the pressure adjusting plate 332 is applicable to the main roller 37. In addition, even if the position of the main roller 37 changes due to an error in the circularity of the main roller and a distortion, etc., the pressure adjusting plate 332 is freely movable in accordance with such a position change. Accordingly, the pressure applied from the main roller 37 can be made uniform. The material of the first frame 331 and that of the second frame 321 are not limited to any particular ones as long as such materials match the molding condition, but when, for example, the first and second frames are applied to an imprinting process, it is desirable that the materials should have the pressure resistance and the heat resistance under the molding condition. Hence, a metal like stainless steel is applicable. In addition, it is not illustrated in the figure but in order to stably hold the pressure adjusting plate 332 even if the main roller 37 moves, a guide that supports the pressure adjusting plate 332 so as to be in parallel with the pressure receiving stage 322 may be further provided.

In order to surely seal the pressure adjusting room 30, pressure adjusting room sealers 34 to intimately seal a space between the first frame 331 and the pressure adjusting plate 332 and a space between the first frame 331 and the second frame 321, and further a space between the second frame 321 and the pressure receiving stage 322 may be further provided. For example, as illustrated in FIG. 1, the pressure adjusting room sealer 34 that is an O-ring is prepared, a concave groove shallower than the diameter of the cross-section of the O-ring is formed in the part of the pressure adjusting plate 332 to be in contact with the first frame 331, the part of the second frame 321 to be in contact with the first frame 331, and further the part of the pressure receiving stage 322 to be in contact with the second frame 321, and the O-ring can be disposed in this groove.

It is not illustrated in the figure, but it is preferable that a casing moving unit that moves the casing 33 close to or distant from the second frame 321 should be provided. An example casing moving unit is a hydraulic or pneumatic cylinder that moves the first frame 331, or a combination of an electric motor and a ball screw that moves the first frame.

Note that the pressure adjusting plate holder is not limited to the above explained one, and for example, the pressure adjusting room may be provided at a side of the pressure adjusting plate 332 where the main roller 37 is not located. In this case, by applying pressure to the pressure adjusting room using a pressure adjuster 45, the pressure difference can be caused between both faces of the pressure adjusting plate 332.

The pressure adjuster 45 is to adjust a pressure difference in fluid applied to both faces of the pressure adjusting plate 332. An example pressure adjuster 45 is a depressurizer that depressurizes the fluid pressure on the one surface of the pressure adjusting plate 332 or a pressurizer that pressurizes the one surface. Note that the fluid includes a gas and a liquid, but the fluid to the one surface of the pressure adjusting plate 332 may be a gas, while the fluid to the other surface of the pressure adjusting plate may be a liquid.

When the depressurizer is utilized as the pressure adjuster 45, in order to pressurize the die 1 and the molding target 2 by the main roller 37, it is appropriate if, in the fluid pressures applied to both faces of the pressure adjusting plate 332, the pressure at the pressure-adjusting-room-30 side is adjusted so as to be relatively small. Hence, force produced by the pressure difference applied to the pressure adjusting plate 332 can act on the main roller 37, and thus the pressurizing force by the main roller 37 can be adjusted to a predetermined pressure. Note that in this case, the exterior of the pressure adjusting room 30 may be surrounded by either a gas or a liquid.

For example, as illustrated in FIG. 1, the depressurizer may include a channel 451 connected to the pressure adjusting room 30, a depressurizing pump 452 that discharges a gas in the pressure adjusting room 30 through the channel 451, and an ON-OFF valve 453 that opens or closes the channel 451. In addition, in order to let the pressure adjusting room 30 to return to the atmospheric pressure, an ON-OFF channel 455 provided with an ON-OFF valve 454 is also provided. The depressurizer is also applicable to repel a gas present between the die 1 and the molding target 2 by reducing the pressure in the pressure adjusting room 30. In this case, it is preferable to provide a remover that moves apart the die 1 and the molding target 2 from each other. An example remover is a set of push-up pins 323 which supports, at multiple locations, a frame 11 supporting the end of the die 1, and which is movable such a frame up and down. The push-up pins 323 are disposed in multiple holes, respectively, formed in the pressure receiving stage 322, and are movable up and down by, for example, an air cylinder. The hole is located at a position where the push-up pin 323 can be engaged with a recess formed in the frame 11.

In addition, after a gas present between the die 1 and the molding target 2 is repelled, the die 1 and the molding target 2 may be laid on with each other, and the ON-OFF channel 455 may be opened through the ON-OFF valve 454 to return the pressure adjusting room 30 to be an ambient pressure, thereby causing the die 1 and the molding target 2 to be intimately in contact with each other.

In addition, when the pressurizer is utilized as the pressure adjuster 45, it is not illustrated in the figures, but a pressure adjusting room may be provided at a side of the pressure adjusting plate 332 where the main roller 37 is not present, and the fluid pressure applied to both, surfaces of the pressure adjusting plate 332 may be adjusted in such a way that the pressure at the pressure-adjusting-room side becomes relatively large. An example pressurizer applicable is, for example, a pressurizing tank that supplies a gas like compressed air to the pressure adjusting room. In addition, as another example structure, a liquid like water or oil may be applied as a fluid in the pressure adjusting room, and pressure may be applied to the pressure adjusting plate 332 may by this fluid. In this case, as the pressurizer, a pump or a cylinder, etc., that adjusts the fluid pressure in the pressure adjusting room may be utilized.

Note that pressure sensors that adjusts respective pressures applied to both surfaces of the pressure adjusting plate 332 may be provided, and the pressure difference applied to both surfaces of the pressure adjusting plate 332 may be adjusted based on detection information from the pressure sensors.

In addition, the pressure adjuster is not limited to a structure that utilizes a fluid pressure, but may employ a structure that adjusts, by a weight, force applied to the main roller 37. For example, an arbitrarily weight may be put on the upper surface of the pressure adjusting plate 332, and the pressurizing force by the main roller 37 may be adjusted. In addition, without a weight, a structure that enables a pressure application by only the weight of the main roller 37, the weight of the intermediate roller 38, and the weight of the backup roller 39 may be also applicable.

The roller moving unit is to move the main roller 37 relative to the object that is the die 1 and the molding target 2, and to depress the whole molding face of the die 1 against the molding target 2. The roller moving unit is not limited to any particular structure as long as it can move the main roller 37, but for example, as illustrated in FIG. 6, a moving plate 382 movable on guide rails 381 provided on the pressure adjusting plate 332, a screw 383 that converts the rotation motion into the linear motion of the moving plate 382, and an electric motor that turns the screw 383. In addition, the main roller 37, the intermediate rollers 38, and the backup rollers 39 may have respective both ends of the rotation axes fastened to the moving plate. In this case, it is preferable that, at the time of pressurization, force applied to the main roller 38 should be all supported by the intermediate rollers 38, and force applied to the intermediate rollers 38 should be all supported by the respective backup rollers 39. In addition, when a structure in which the main roller 37 and the intermediate rollers 38 do not firmly contact with each other except a pressurizing operation is employed, a deformation of the main roller 37 by the contacts of the respective rollers is avoidable. Hence, at the time of pressurization, in order to apply no load to both axial ends of the main roller 38 and those of the respective intermediate rollers 38, and to cause the rollers not to firmly contact with each other except a pressurizing operation, it is preferable that each bearing should have a play that permits the respective axial ends to move horizontally or vertically. According to this structure, the rollers are in contact with each other only at the time of pressurization. For example, the shaft of the main roller 37 and that of each, intermediate roller 38 may have respective both ends held by respective bearings that have a slightly larger diameter than that of the shaft. Moreover, in order to appropriately support force applied to both ends of the shafts of the respective backup rollers 39, as illustrated in FIG. 6, it is preferable that the guide rails 381 should be disposed in a manner aligned with both ends of the backup rollers 39. The roller moving unit may be a manual mechanism that turns the screw 383 through a handle instead of the electric motor.

The pressure receiving stage 322 is to receive pressure from the main roller 37 via the object that is the die 1 and the molding target 2. In the pressure receiving stage 322, a pressure receiving surface that contacts the die 1 or the molding target 2 is formed so as to be sufficiently large and smooth. This pressure receiving surface can be formed in an appropriate shape, such as a planar shape or a curved shape, in accordance with the shape of the die 1 or the molding target 2 to be supported. In addition, the pressure receiving stage 322 may be formed so as to construct the pressure adjusting room 30 together with the pressure adjusting plate holder. For example, the pressure receiving stage 322 may be formed in a shape with a protruding cross section that includes the protrusion 322a that is fittable in the opening of the second frame 321, and a flange 322b which extends horizontally from the lower part of the protrusion 322a, and which supports the lower end of the second frame via air cylinders, etc. In addition, the pressure receiving stage may be formed in a roller shape. In this case, a second casing that forms a sealed space together with the casing 33 is provided, and the sealed space formed by the casing 33 and the second casing serves as a pressure adjusting room. In addition, the object is held between the main roller 37 and the roller-shape pressure receiving stage in this pressure adjusting room, and the object is moved relative to the main roller 37 and the pressure receiving stage. The material of the pressure receiving stage 322 is not limited to any particular one as long as it matches the molding condition, but when, for example, the pressure receiving surface is applied to an imprinting process, it is preferable that the material should have the pressure resistance and the heat resistance under the molding condition, and for example, a metal like stainless steel is applicable. When the die 1 or the molding target 2 is heated from the pressure-receiving-stage-322 side, it is preferable to use a material like a metal having a high thermal conductivity. Conversely, when the die 1 or the molding target 2 is heated from the pressure-adjusting-room-30 side, it is fine if a material with a low thermal conductivity is applied in order to prevent heat from escaping to the pressure receiving stage 322, but in order to suppress an uneven heating, it is preferable that the pressure receiving face should be formed of a material having a high thermal conductivity. In an optical imprinting process, when a light source is disposed at the pressure-receiving-stage-322 side, it is appropriate if a transparent material like a glass is applied. In order to suppress an unnecessary transfer trace on the molding target 2, the die 1 and the pressure receiving stage 322 may be formed integrally with each other. For example, according to conventional technologies, a pattern is formed by electroforming, and only the pattern portion is cut out and is utilized, but it can be directly used without a cut-out.

In addition, the explanation was given of an example case in which the casing 33 including the pressure adjusting plate 332 is freely movable up and down relative to the pressure receiving stage 322 even if the casing abuts the second frame 321. However, a fastener that fastens the pressure adjusting plate 332 in a manner apart from the pressure receiving stage 322 by a predetermined distance may be further provided. According to this structure, when the pressure inside the pressure adjusting room 30 is reduced to repel a gas present between the die 1 and the molding target 2, the lower end of the main roller 37 disposed on the pressure adjusting plate 332 can be positioned at a location where excessive force is not applied to the object that is the die 1 or the molding target 2, preferably, a location not contacting the object. An example fastener is a set of cotters 333 slidable between the lower surface of the second frame 321 and the upper surface of the flange 322b of the pressure receiving stage 322. The cotter 333 is formed in, for example, a cuboid shape, and is disposed at each of four sides of the second frame 321 in a rectangular shape at an appropriate spacing.

It is not illustrated in the figure but a temperature adjuster that adjusts the temperature of the molding target 2 by heating or cooling may be further provided. Hence, the fluidity, etc., of a molding target layer of the molding target 2 can be adjusted. In addition, when the imprinting device of the present disclosure is applied to thermal imprinting, the molding target 2 can be heated to a temperature equal to or higher than the glass transition temperature, and depressed while the main roller 37 is rolled over to flatten the molding target layer. An example temperature adjuster is a heater that directly or indirectly heats the molding target layer, or a cooler that cools the molding target layer.

The heater is not limited to any particular one as long as it can heat the molding target 2 to a predetermined temperature, e.g., equal to or higher than the glass transition temperature or melting temperature of the molding target layer. In addition, the heater may heat the molding target 2 from the pressure-receiving-stage-322 side or from the pressure-adjusting-room-30 side. For example, a heater may be provided in the main roller 37 or the pressure receiving stage 322 to heat the molding target 2 from the pressure-receiving-stage-322 side. Still further, a radiant heat source, such as a ceramic heater or a halogen heater, that emits electromagnetic waves to perform heating may be provided in the pressure adjusting room 30 to heat the molding target 2. The molding target can be heated by heated liquid or gas.

The cooler is also not limited to any particular one as long as it can cool the molding target 2 to a predetermined temperature. In addition, the cooler may cool the molding target 2 from the pressure-receiving-stage-322 side or from the pressure-adjusting-room-30 side. For example, a water jacket for cooling may be provided in the pressure receiving stage 322 to cool the molding target 2 from the pressure-receiving-stage-322 side.

When the imprinting device of the present disclosure is applied to an optical imprinting process, it is appropriate if a light source that emits electromagnetic waves with a predetermined wavelength to the molding target 2 is provided in the pressure adjusting room 30 or the pressure receiving stage 322. Although it is not illustrated in the figure, a casing with an opening toward the molding target may be disposed in a movable manner at the backward location in the moving direction of the main roller 37, and the light source may be disposed in such a casing. According to this structure, the number of light sources and the necessary output thereof can be reduced.

The explanation was given of an example case in which the roller-type depressing device of the present disclosure is applied to an imprinting device that transfers the mold pattern of the die 1 to the molding target 2, but the roller-type depressing device of the present disclosure is not limited to such an application. For example, the roller-type depressing device of the present disclosure is also applicable in a fluid depressing type imprinting device that depresses the whole surface of the die with fluid pressure, in order to simply push out and eliminate bubbles present between the die 1 and the molding target 2 beforehand.

Next, an explanation will be given of a roller-type depressing method according to the present disclosure. The roller-type depressing method according to the present disclosure is to apply pressure to the object by the main roller 37 that has at least a surface formed of the elastic material 37a, and the method mainly includes a disposing process of disposing the object on the pressure receiving stage 322, a pressure adjusting process of adjusting the pressure applied from the main roller 37 to the object, and a pressure applying process of moving the main roller 37 relative to the object, and applying the pressure to the object by the main roller 37. In addition, in the pressure applying process, the main roller 37 is supported by the intermediate roller 38 that has at least a surface formed of a material which has a larger elastic modulus than the elastic material 37a, and the intermediate roller 38 is supported by the backup roller 39 formed so as to be shorter in the axial direction than the main roller 37 and the intermediate roller 38.

An explanation will be given below of an example case in which the roller-type depressing method according to the present disclosure is applied to an imprinting method, together with an operation of the imprinting device according to the present disclosure. Such an imprinting method is to transfer the mold pattern of the die 1 to the molding target 2, and includes a disposing process of disposing, on the pressure receiving stage 332, the die 1 and the molding target 2 laid on with each other, a pressure adjusting process of adjusting the pressure applied from the main roller 37 to the molding target 2, and a pressure applying process of moving the main roller 37 relative to the molding target 2, and applying the pressure to the die 1 and the molding target 2 by the main roller 37. In addition, in the pressure applying process, the main roller 37 is supported by the intermediate roller 38 that has at least a surface formed of a material which has a larger elastic modulus than the elastic material 37a, and the intermediate roller 38 is supported by the backup roller 39 formed so as to be shorter in the axial direction than the main roller 37 and the intermediate roller 38.

It is preferable to include a depressurizing process of depressurizing the atmosphere between the die 1 and the molding target 2 before the disposing process in order to repel a gas present therebetween. In addition, it is preferable to include, between the depressurizing process and the pressure applying process, an intimate contact process of uniformly depressing the die 1 and the molding target 2 against each other to let the die and the molding target to be intimately in contact with each other.

In the depressurizing process, first of all, with the first frame 331 abutting with the second frame 321, the second frame 321 is moved up. Next, the cotters 333 are slid into the space between the second frame 321 and the flange 322b of the pressure receiving stage 322 to fasten the second frame 333. Subsequently, as illustrated in FIG. 2, the frame 11 that is holding the end of the die 1 is pushed up while being supported by the plurality of push-up pins 323, and the die 1 is moved apart from the molding target 2. Eventually, the interior of the pressure adjusting room 30 is depressurized by the depressurizer, thereby eliminating the gap present between the die 1 and the molding target 2.

In the disposing process, as illustrated in FIG. 3, the push-up pins 323 are moved down so as to dispose the die 1 and the molding target 2 laid on with each other on the pressure receiving stage 322.

In the intimate contact process, the ON-OFF channel 455 is opened through the ON-OFF valve 454 to return the pressure adjusting room 30 to the atmosphere pressure. Hence, pressure is applied to the die 1 and the molding target 2, thereby causing both the die and the molding target to be intimately in contact with each other. When a pressurizer is provided, the die 1 and the molding target 2 may be caused to be intimately in contact with each other by increasing the pressure beyond the atmosphere pressure.

In the pressure adjusting process, first of all, the cotters 333 are slid from the second frame 321 and the flange 322b of the pressure receiving stage 322 to remove the cotters 333, thereby unfastening the second frame 321. Next, as illustrated in FIG. 4, with the first frame 331 and the second frame 321 abutting with each other, the second frame 321 is moved down up to a position that enables the main roller 37 to depress the die 1 and the molding target 2. Subsequently, the pressure adjusting room 30 is depressurized by the depressurizer. In this case, the pressure adjusting plate 332 is pushed toward the pressure receiving stage 322 by atmospheric pressure, and force produced by a pressure difference is applied to the main roller 37. Hence, the die 1 and the molding target 2 are depressed against each other by the main roller 37 at a constant force.

In the depressing process, the main roller 37 is moved by the roller moving unit, and the die 1 and the molding target 2 are depressed against each other at a constant pressure across the respective whole faces. At this time, the main roller 37 is supported by the intermediate roller 38 that has at least a surface formed of a material which has a larger elastic modulus than the elastic material 37a, and the intermediate roller 38 is supported by the backup roller 39 formed so as to be shorter in the axial direction than the main roller 37 and the intermediate roller 38. Hence, an uneven elastic deformation caused in the main roller is prevented or reduced, making it possible for the imprinting device to uniformly depress the object. When the imprinting device includes the pressurizer, after the pressure applying process by the main roller 37, a fluid-pressure applying process of depressing the die 1 and the molding target 2 against each other with a fluid may be further provided. This further ensures the transfer of the mold pattern.

When an optical imprinting is performed, light with a predetermined wavelength is emitted to the molding target after the pressure applying process to cure the molding target layer of the molding target 2, thereby transferring the mold pattern to the molding target layer. When a thermal imprinting is performed, the molding target 2 is heated to a temperature equal to or higher than the glass transition temperature, is depressed by the main roller 37, and cooled down after the main roller 37 moves out. For example, the roller heated to a temperature equal to or higher than the glass transition temperature may be rolled over to heat and depress the molding target, and then the molding target may be cooled down as needed.

Eventually, a demolding process of demolding the die 1 from the molding target 2 is performed. The demolding process is not limited to any particular one as long as such a process is capable of releasing the die 1 from the molding target 2, and conventionally well-known technologies in the art are applicable as needed.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

REFERENCE SIGNS LIST

1 Die
2 Molding target
30 Pressure adjusting room
33 Casing
34 Pressure adjusting room sealer
37 Main roller
38 Intermediate roller
39 Backup roller
45 Pressure adjuster
321 Second frame
322 Pressure receiving stage
331 First frame
332 Pressure adjusting plate

The invention claimed is:
1. A roller-type depressing device to depress an object in a pressure adjusting room, the device comprising:
a main roller which has at least a surface formed of an elastic material, and which depresses the object;
a pressure adjusting plate that supports the main roller;
a roller moving unit that moves the main roller relative to the object in the pressure adjusting room, wherein the roller moving unit is provided on the pressure adjusting plate;
a pressure receiving stage that receives the depressing pressure from the main roller via the object;
a pressure adjusting unit that holds the pressure adjusting plate in such a way that force produced by a pressure difference in fluid applied to both faces of the pressure adjusting plate acts on the main roller, wherein the pressure adjusting room is defined by a pressure adjusting plate holder of the pressure adjusting unit that holds the pressure adjusting plate so as to apply force to the main roller, a first of the both faces of the pressure adjusting plate, and either the object or the pressure receiving stage, wherein a pressure adjuster adjusts the pressure difference in fluid applied to both faces of the pressure adjusting plate, and wherein a second of the both faces of the pressure adjusting plate is exterior to each of the pressure adjusting unit and the pressure adjusting room;
an intermediate roller which has at least a surface formed of a material that has a larger elastic modulus than the elastic material, and which is disposed adjacent to and supports the main roller; and a backup roller, the backup roller having a shorter axial length than each of the main roller and the intermediate roller, and the backup roller being disposed adjacent to and supporting the intermediate roller, wherein the intermediate roller is disposed between the main roller and the backup roller.

2. The roller-type depressing device according to claim 1, wherein the intermediate roller is one of a plurality of intermediate rollers, wherein each of the intermediate rollers is disposed on a circumference of the main roller.

3. The roller-type depressing device according to claim 2, wherein the backup roller is one of a plurality of backup rollers, each of the backup rollers being disposed on a circumference of one of the intermediate rollers.

4. The roller-type depressing device according to claim 3, wherein backup rollers of the plurality of backup rollers are disposed at an equal angle on both sides of two separate planes that respectively interconnect a rotation center of the main roller with a rotation center of a respective one of the intermediate rollers.

5. The roller-type depressing device according claim 2, wherein each of the intermediate rollers is formed of a metal or ceramics.

6. The roller-type depressing device according to claim 1, wherein the backup roller is one of a plurality of backup rollers, each of the backup rollers being disposed on a circumference of the intermediate roller.

7. The roller-type depressing device according to claim 6, wherein backup rollers of the plurality of backup rollers are disposed at both sides of a plane that interconnects a rotation center of the main roller with a rotation center of the intermediate roller at an equal angle.

8. The roller-type depressing device according claim 1, wherein the intermediate roller is formed of a metal or ceramics.

9. The roller-type depressing device according claim 1, wherein the intermediate roller is longer in an axial direction than the main roller.

10. The roller-type depressing device according to claim 1, wherein the pressure adjusting plate holder is constructed from the pressure adjusting plate, a first frame enclosing the pressure adjusting room, and a movable second frame against which the first frame closes so as to seal the pressure adjusting room, the second frame being supported by constant fluid pressure so that when the pressure adjusting room is closed and sealed by the first and second frames, the pressure adjusting plate, together with the first frame, is freely movable relative to the pressure receiving stage by way of the force produced by the pressure difference.

11. An imprinting device comprising the roller-type depressing device according to claim 1.

* * * * *